United States Patent
Yang et al.

(10) Patent No.: US 8,610,267 B2
(45) Date of Patent: Dec. 17, 2013

(54) REDUCING DELAMINATION BETWEEN AN UNDERFILL AND A BUFFER LAYER IN A BOND STRUCTURE

(75) Inventors: Ching-Jung Yang, Pingzhen (TW); Chang-Pin Huang, Yangmei Township (TW); Tzuan-Horng Liu, Longtan Township (TW); Michael Shou-Ming Tong, San Diego, CA (US); Ying-Ju Chen, Tuku Township (TW); Tung-Liang Shao, Hsin-Chu (TW); Hsien-Wei Chen, Sinying (TW); Hao-Yi Tsai, Hsin-Chu (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 77 days.

(21) Appl. No.: 12/840,900

(22) Filed: Jul. 21, 2010

(65) Prior Publication Data

US 2012/0018875 A1 Jan. 26, 2012

(51) Int. Cl.
*H01L 23/48* (2006.01)

(52) U.S. Cl.
USPC ............ 257/737; 257/738; 257/773; 438/618

(58) Field of Classification Search
USPC .......................................... 257/737
See application file for complete search history.

(56) References Cited

U.S. PATENT DOCUMENTS

| | | | | |
|---|---|---|---|---|
| 5,977,632 A | * | 11/1999 | Beddingfield | 257/737 |
| 2003/0071354 A1 | * | 4/2003 | Tsai et al. | 257/738 |
| 2004/0089954 A1 | * | 5/2004 | Hembree et al. | 257/780 |
| 2006/0068595 A1 | * | 3/2006 | Seliger et al. | 438/737 |
| 2007/0075423 A1 | * | 4/2007 | Ke et al. | 257/737 |

* cited by examiner

Primary Examiner — Ajay K Arora
(74) Attorney, Agent, or Firm — Slater & Matsil, L.L.P.

(57) ABSTRACT

A die includes a metal pad, a passivation layer, and a patterned buffer layer over the passivation layer. The patterned buffer layer includes a plurality of discrete portions separated from each other. An under-bump-metallurgy (UBM) is formed in an opening in the patterned buffer layer and an opening in the passivation layer. A metal bump is formed over and electrically coupled to the UBM.

19 Claims, 8 Drawing Sheets

REDUCING DELAMINATION BETWEEN AN UNDERFILL AND A BUFFER LAYER IN A BOND STRUCTURE

TECHNICAL FIELD

This disclosure relates generally to integrated circuits, and more particularly to flip-chip bond structures and methods for forming the same.

BACKGROUND

In the manufacturing of wafers, integrated circuit devices such as transistors are first formed at the surfaces of semiconductor substrates in the semiconductor wafers. Interconnect structures are then formed over the integrated circuit devices. Bumps are formed on the surfaces of the semiconductor wafers, and are electrically coupled to integrated circuit devices. The semiconductor wafers are sawed into semiconductor chips, also commonly known as dies.

In the packaging of the semiconductor chips, the semiconductor chips are often bonded with package substrates using flip-chip bonding. Solder bumps are used to join the bumps in the semiconductor chips to the bond pads in the package substrates. Underfill is used to protect the solder bumps.

FIG. 1 illustrates an exemplary bond structure for bonding chip 202 and package substrate 204. Solder bump 210 is used to bond metal feature 212 (such as an under-bump metallurgy (UBM)) in chip 202 to bond pad 214 in package substrate 204. Polyimide layer 220 is formed on the surface of chip 202. Underfill 216 is filled between chip 202 and package substrate 204, and is in contact with polyimide layer 220. The structure as shown in FIG. 1 suffer from delamination between underfill 216 and polyimide layer 220, The delamination is caused due to process issues such as the warpage resulted from the high stress near the interface between underfill 216 and polyimide layer 220. The stresses also result in the growth of any delamination in the lateral directions.

SUMMARY

In accordance with one aspect, a die includes a metal pad, a passivation layer, and a patterned buffer layer over the passivation layer. The patterned buffer layer includes a plurality of discrete portions separated from each other. An under-bump-metallurgy (UBM) is formed in an opening in the patterned buffer layer and an opening in the passivation layer. A metal bump is formed over and electrically coupled to the UBM.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2 through 7A are cross-sectional views of intermediate stages in the manufacturing of a bond structure in accordance with an embodiment.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel bond structure is provided in accordance with an embodiment. The variations of the embodiment are discussed. Throughout the various views and illustrative embodiments, like reference numbers are used to designate like elements.

Figure 1:
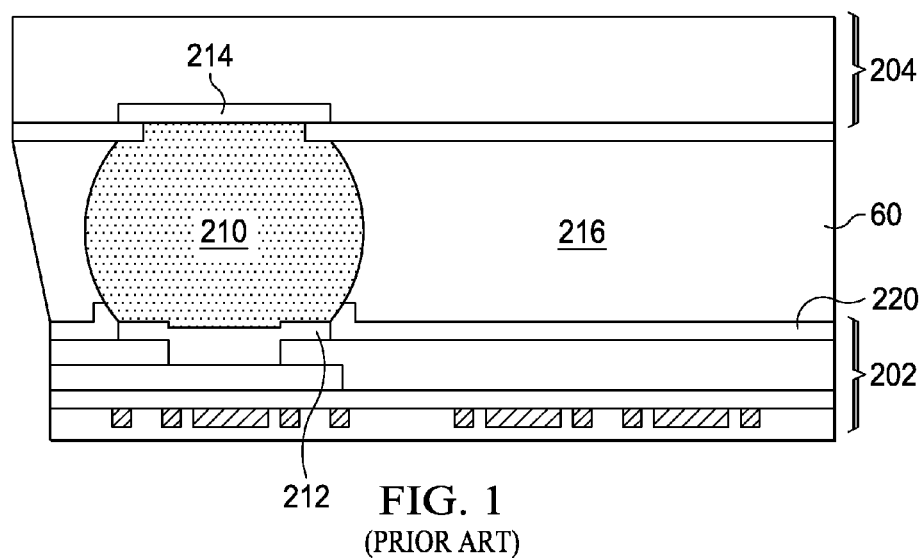
FIG. 1 illustrates a cross-sectional view of a conventional bond structure.
Figure 2:
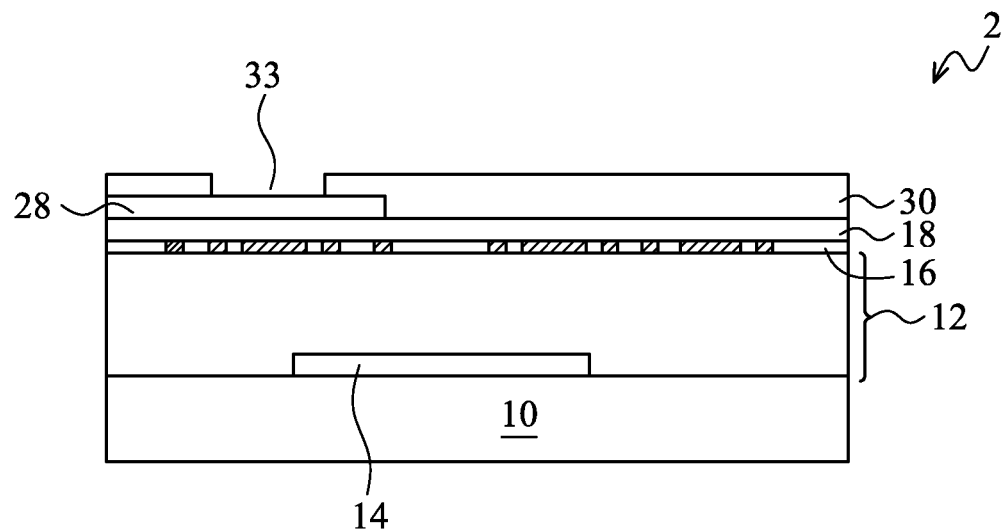

Referring to FIG. 2, wafer 2, which includes substrate 10, is provided. Wafer 2 may be a device wafer that includes active devices such as transistors therein, although it may also be a wafer of package substrates or an interposer wafer that does not have active devices therein. In an embodiment wherein wafer 2 is a device wafer, substrate 10 may be a semiconductor substrate such as a silicon substrate, although it may include other semiconductor materials. Semiconductor devices 14 such as transistors may be formed at a surface of substrate 10. Interconnect structure 12, which includes metal lines and vias (not shown) formed therein and connected to semiconductor devices 14, is formed over substrate 10. The metal lines and vias may be formed of copper or copper alloys, and may be formed using the well-known damascene processes. Interconnect structure 12 may include a commonly known inter-layer dielectric (ILD, shown) and inter-metal dielectrics (IMDs, not shown). The IMDs includes top-metal dielectric 16 as a topmost layer, in which top metal features such as metal lines are formed. The ILD and the IMDs may be formed of low-k dielectric materials, for example, with k values less than about 3.0, or even less than about 2.5.

Passivation layer 18 (alternatively referred to as passivation 1) is formed over top-metal dielectric 16. Metal pad 28 is formed over passivation layer 18. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 14, for example, through the underlying interconnect structure 12. Passivation layer 30 (alternatively referred to as passivation 2) may be formed to cover edge portions of metal pad 28, with opening 33 formed in passivation layer 30 to exposed metal pad 28. In an exemplary embodiment, passivation layers 18 and 30 are formed of dielectric materials such as silicon nitride, silicon oxide, polyimide, or composite layers thereof.

Figure 3:
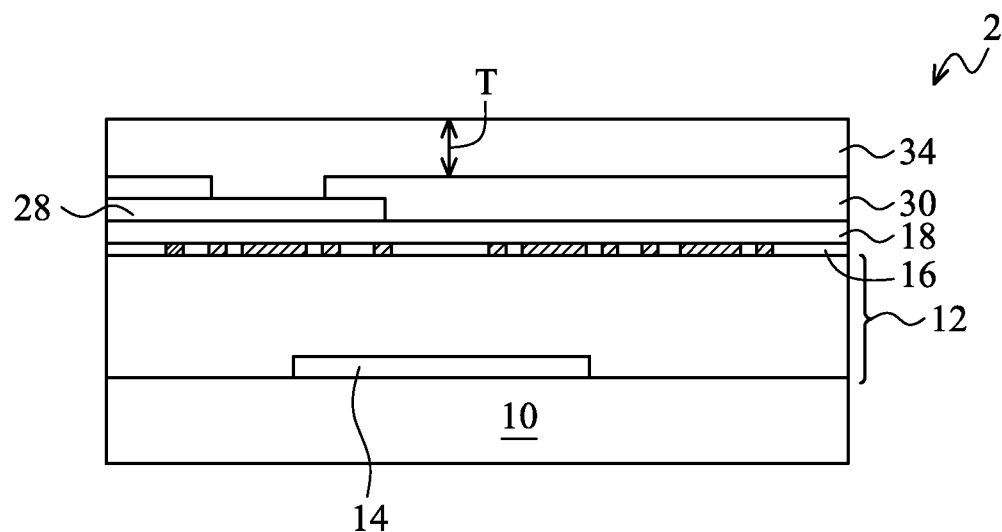

Referring to FIG. 3, buffer layer 34 is formed over, and may contact, passivation layer 30. Buffer layer 34 and passivation layer 30 are formed of different dielectric materials. Buffer layer 34 may be formed of a material that is softer, or having a greater elasticity, than the material of passivation layer 30. In an example embodiment, buffer layer 34 is formed of polyimide, organic materials, or the like. Thickness T of buffer layer 34 may be between about 2.5 µm and about 20 µm, for example.

Figure 4A:
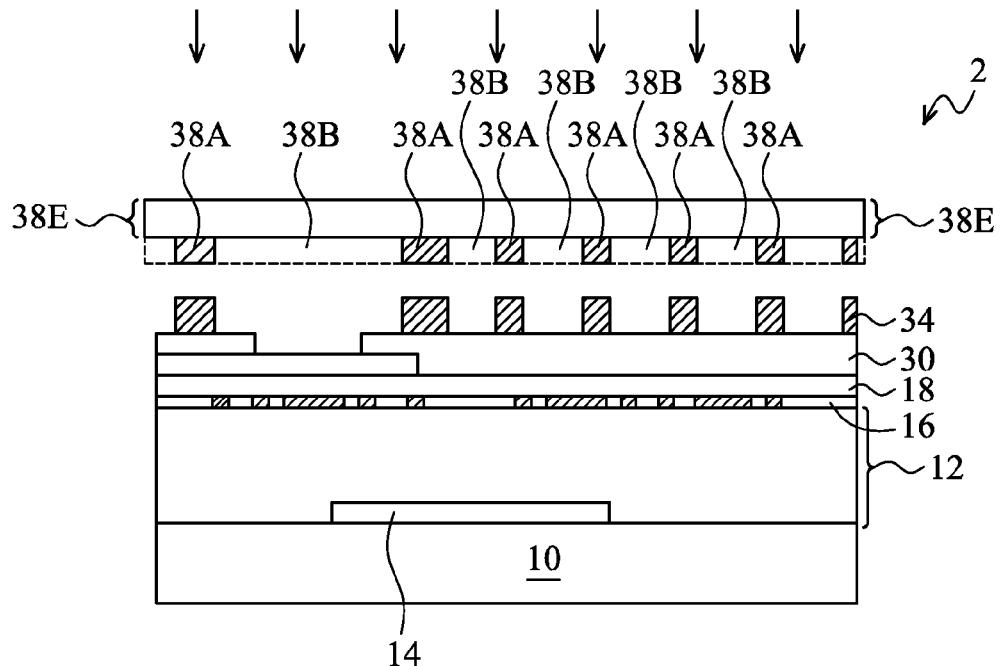
Figure 4B:
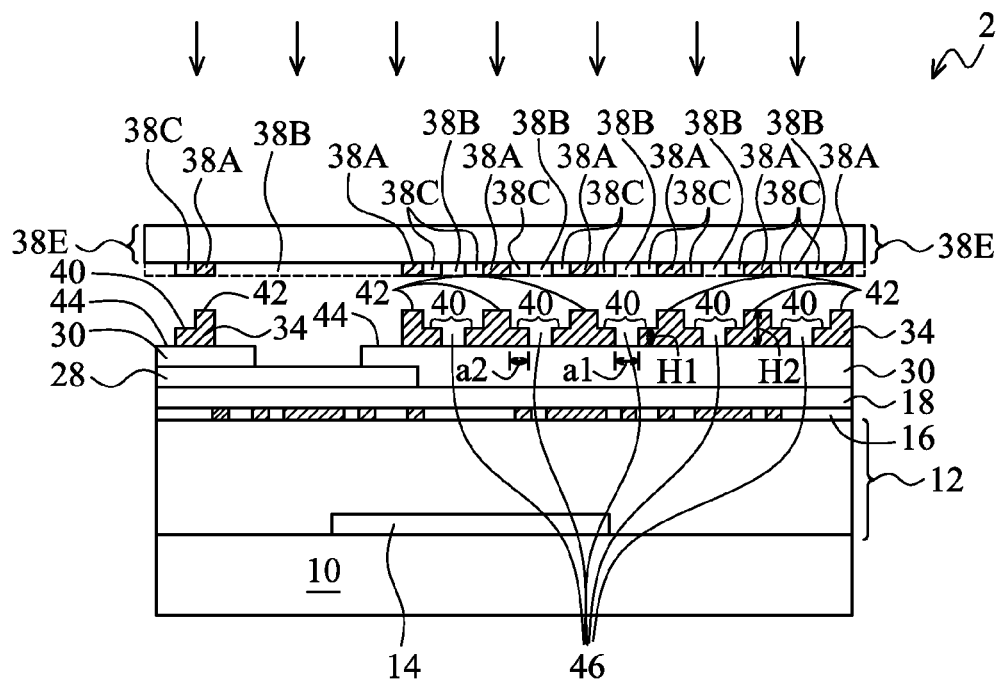
Figure 4C:
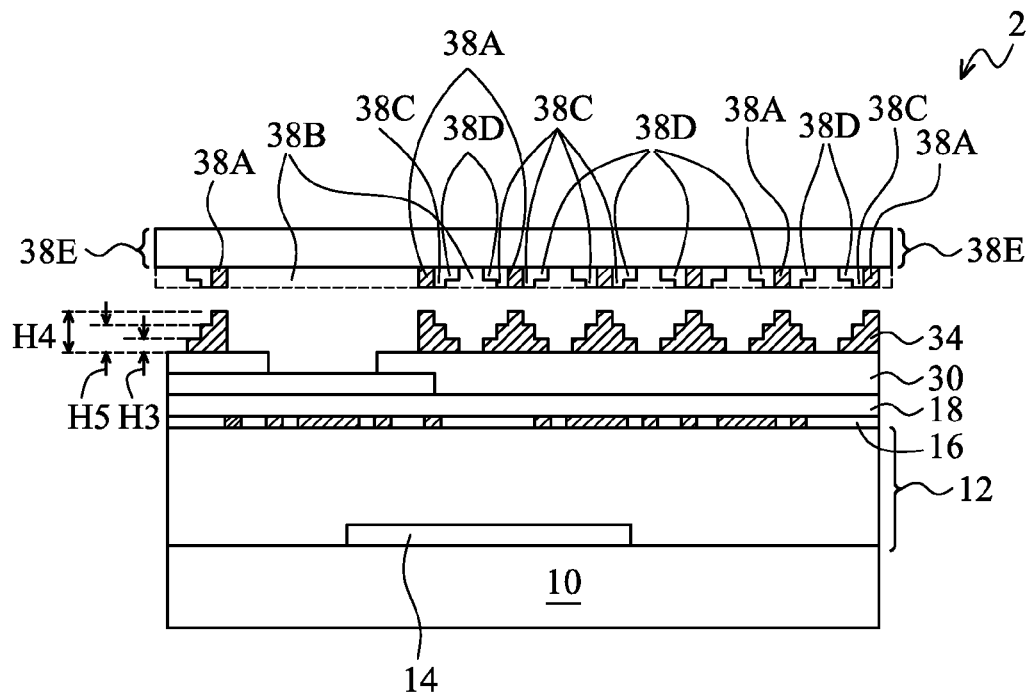

FIGS. 4A through 4C illustrate the patterning of buffer layer 34. Referring to FIG. 4A, lithography mask 38 is provided, and includes opaque portions 38A for blocking light and transparent portions 38B allowing light to pass through. Further, lithography mask 38 may include transparent layer 38E, which may be a glass substrate. Using lithography mask 38, buffer layer 34 is patterned, with some portions of buffer layer 34 being removed, and some portions of buffer layer 34 remaining. When buffer layer 34 is formed of polyimide, which is a photo resist, the portions of buffer layer 34 subject to the light (symbolized using arrows) can be removed using known methods for developing exposed photo resist. The underlying passivation layer 30 and metal pad 28 are exposed through the openings in buffer layer 34. It is appreciated that in the illustrated embodiments, polyimide 34 is shown as being a positive photo resist, wherein the exposed portions of polyimide 34 are removed, while the unexposed portions of polyimide 34 remain not removed. However, polyimide 34 may also be formed of a negative photo resist, and the unexposed portions of polyimide 34 are removed, while the exposed portions of polyimide 34 remain not removed.

FIG. 4B illustrates the formation of patterned buffer layer 34 with steps 40. Steps 40, which are substantially flat surfaces, are lower than top surfaces 42 of buffer layer 34, and higher than the top surface 44 of passivation layer 30 (wherein top surface 44 is also at the same level as the bottom surface of patterned buffer layer 34). As shown in FIG. 4B, top surfaces 40 and 42 may be substantially parallel to each other, and substantially parallel to top surface 44 of passivation layer 30. In an embodiment, lithography mask 38 is a half-tone mask including opaque portions 38A, transparent portion 38B, and half-tone portions 38C. Portions 38A, 38B, and 38C have different light penetration rates, and portions 38C have a light-penetration rate between that of opaque portions 38A and transparent portion 38B. Accordingly, portions of buffer layer 34 receive the light passing through half-tone portions 38C, and hence steps 40 are formed. In an embodiment, a ratio of step height H2 to height H1 is between about 1 and about 5. Further, a ratio of horizontal dimension a2 to horizontal dimensional may be between about 1 and about 5, wherein horizontal dimensional is the dimension of opening 46 that extends to top surface 44 of passivation layer 30, while horizontal dimension a2 is the horizontal dimension of steps 40.

FIG. 4C illustrates the formation of buffer layer 34 with two steps 40 and 48 having different steps heights H3 and H5, respectively. The height of entire buffer layer 34 is denoted as height H4. The formation of the structure is performed using lithography mask 38 that includes portions 38C and 38D having two different light-penetration rates, wherein the light-penetration rates of portions 38C and 38D are between that of opaque portions 38A and transparent portion 38B. Again, the patterning of buffer layer 34 and the exposure of metal pad 28 are performed in a same lithography process.

Figure 5:
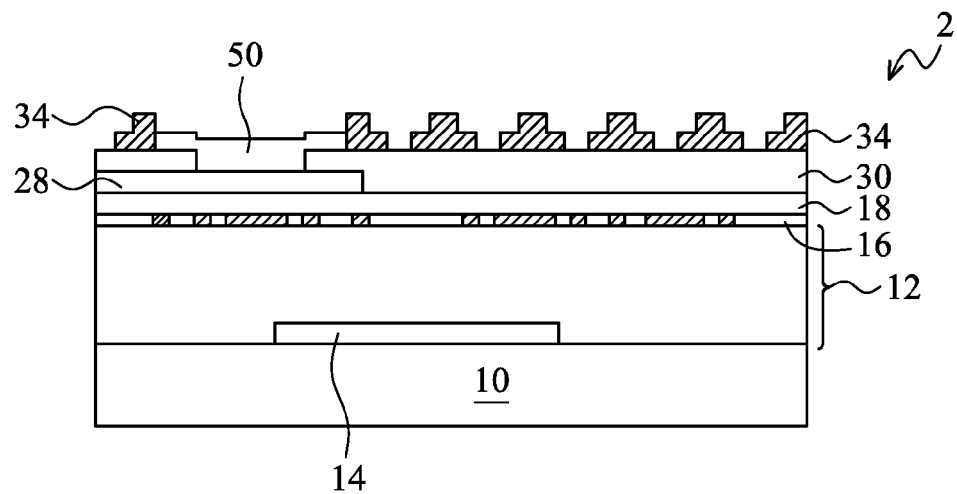
Figure 6:
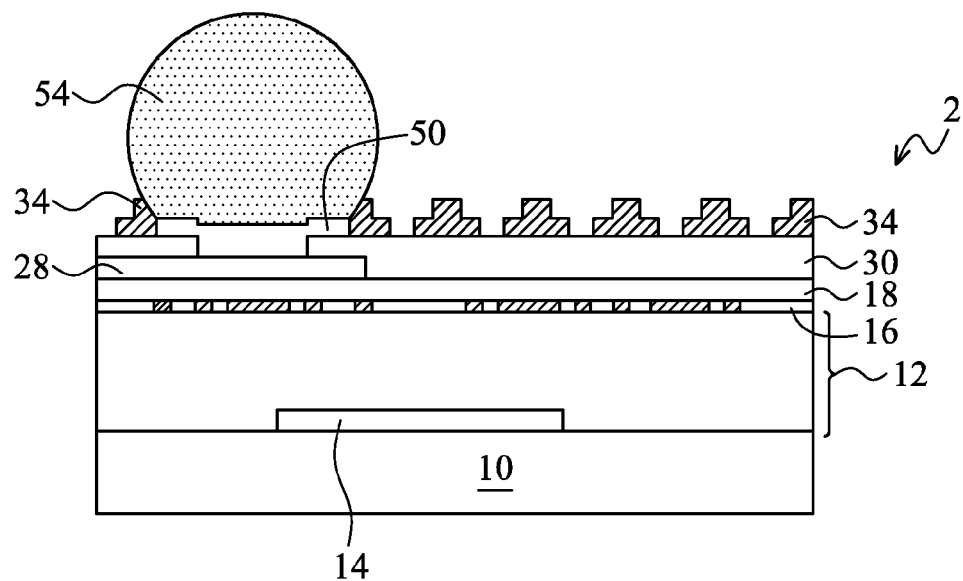

Referring to FIG. 5, Under bump metallurgy (UBM) 50 is formed on, and electrically connected to, metal pad 28. UBM 50 may include a titanium layer, and a copper layer over the titanium layer (not shown). An exemplary formation process of UBM 50 includes forming a mask (not shown) on passivation layer 30 and patterned buffer layer 34, patterning the mask to form an opening, through which metal pad 28 is exposed. A plating is then performed to form UBM 50 in the opening in the mask. The mask is then removed. Next, as shown in FIG. 6, solder bump 54 is formed on UBM 50, and may be re-flowed as a solder ball. In an embodiment, solder bump 54 is formed by electroless plating, so that solder is only plated on UBM 50, but not on passivation layer 30 and buffer layer 34.

Figure 7A:
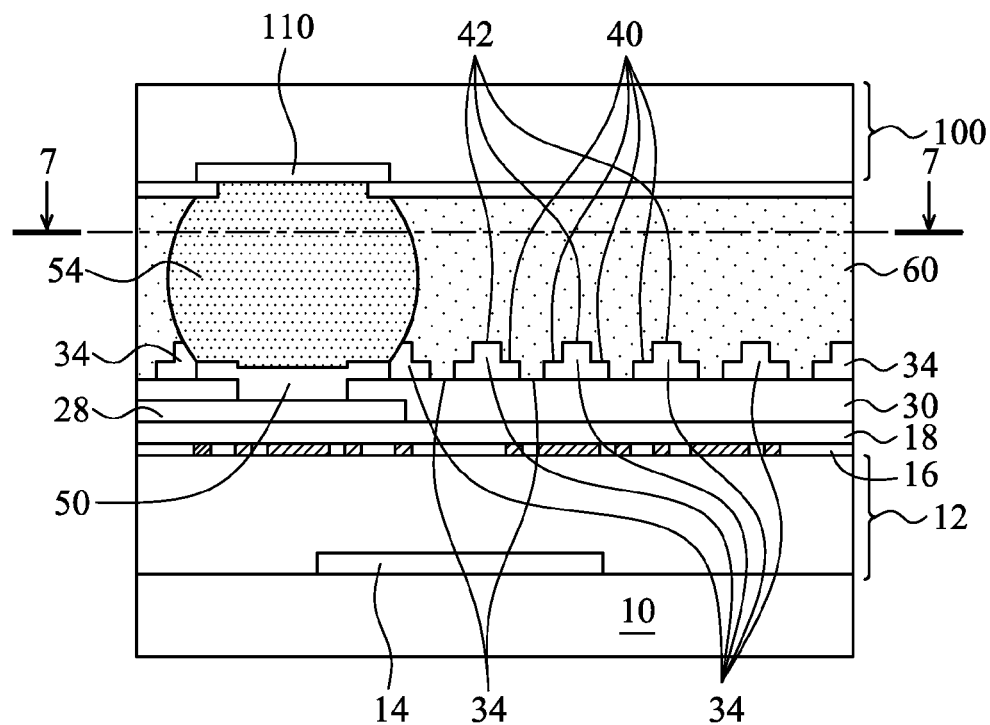

Wafer 2 may be sawed into dies (also referred to as first work pieces throughout the description). Referring to FIG. 7A, first work piece 56, which is a portion sawed from wafer 2, is bonded to second work piece 100, which may be a device die, a package substrate, or an interposer. In an exemplary embodiment, solder bump 54 is bonded to bond pad 110 in second work piece 100. Bond pad 110 may be formed of copper (for example, pure or substantially pure copper), aluminum, silver, palladium, alloys thereof, and multi-layers thereof.

Underfill 60 is filled into the space between first work piece 56 and second work piece 100. Underfill 60 thus encircles and protects solder bump 54 from stresses. It is observed that underfill 60 includes a portion over buffer layer 34, and portions extending into the spacing between portions of buffer layer 34. Further, underfill 60 contacts the sidewalls of portions of buffer layer 34, top surfaces 40 and 42 of buffer layer 34, and top surface 44 of passivation layer 30.

FIGS. 7B through 7F illustrates top views of the structure in FIG. 7A in accordance with various embodiments, wherein the top views are obtained from the plane crossing line 7-7 in FIG. 7A. In FIGS. 7B through 7F, each of the remaining portions of buffer layer 34 may have a uniform height as shown in FIG. 4A, or may include a center portion with a height greater than the height of edge portions, as shown in FIGS. 4B and 4C.

Figure 7B:
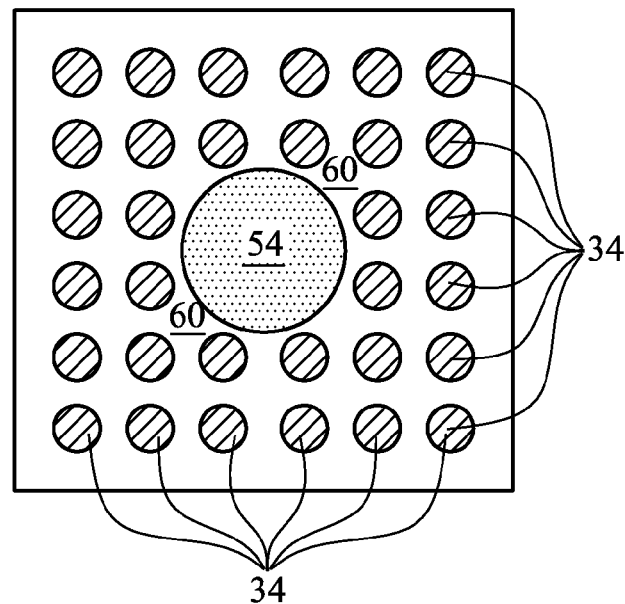
FIGS. 7B through 7F are top views of the structure shown in FIG. 7A.
Figure 7C:
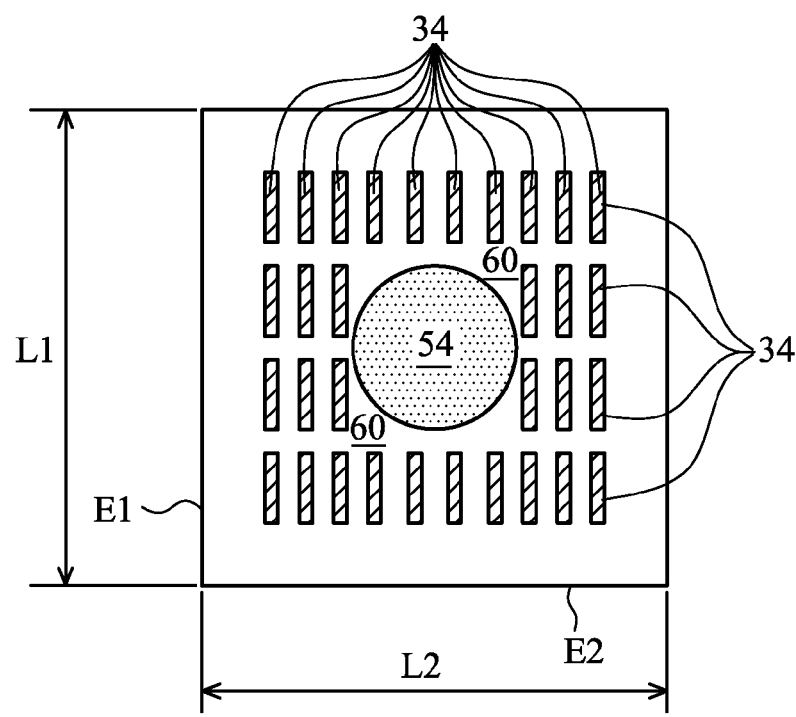
Figure 7D:
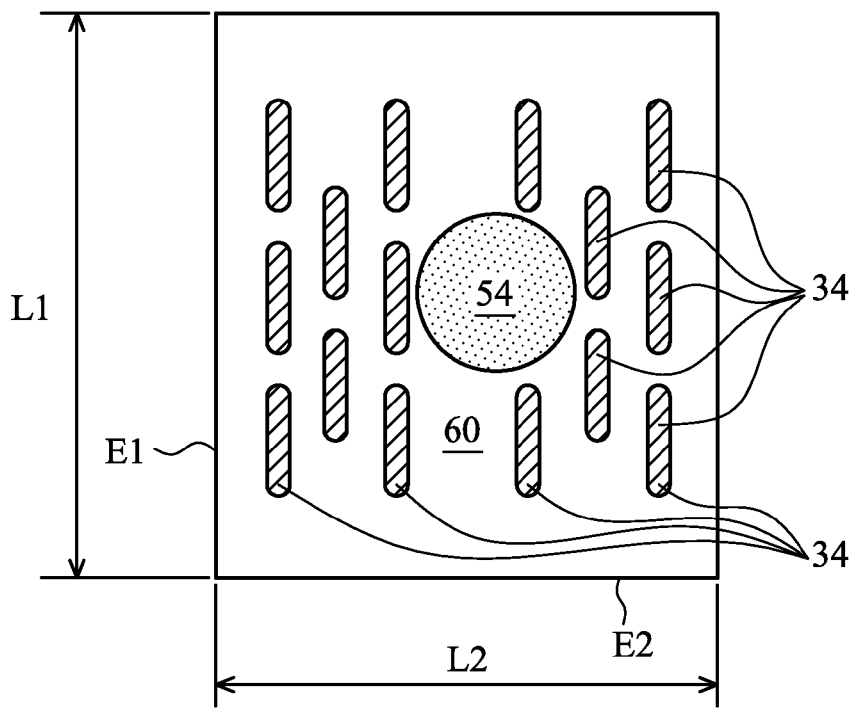

Referring to FIG. 7B, the remaining portions of buffer layer 34 form discrete posts (also denoted using reference numeral 34) isolated from each other by underfill 60. In FIGS. 7C and 7D, the remaining portions of buffer layer 34 form discrete strips isolated from each other by underfill 60. In an embodiment, assuming first work piece 56 has long edge E1 and short edge E2, with the length L1 of long edge E1 greater than the length L2 of short edge E2, then the longitudinal directions of discrete strips 34 may be parallel to long edge E1. Further, in FIG. 7C, strips 34 form an array. In FIG. 7D, strips 34 are arranged in alternating positions in each row and column.

Figure 7E:
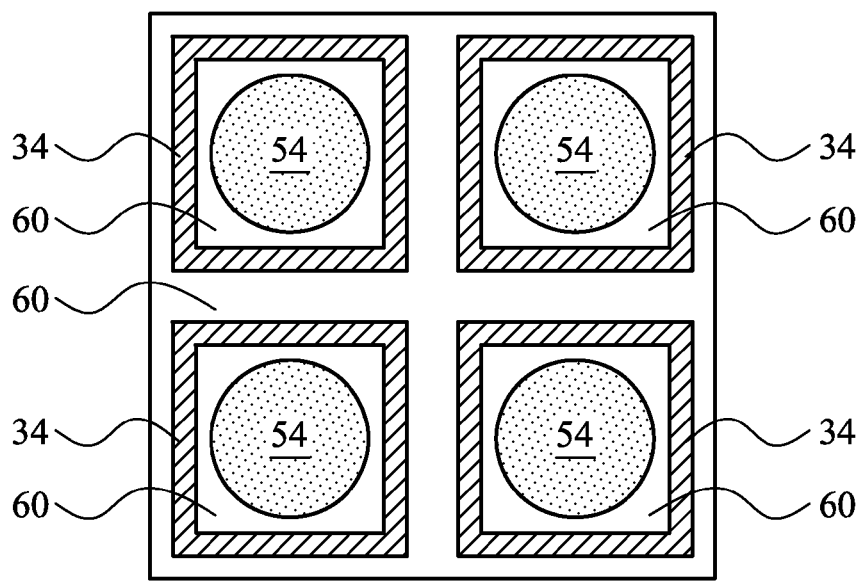
Figure 7F:
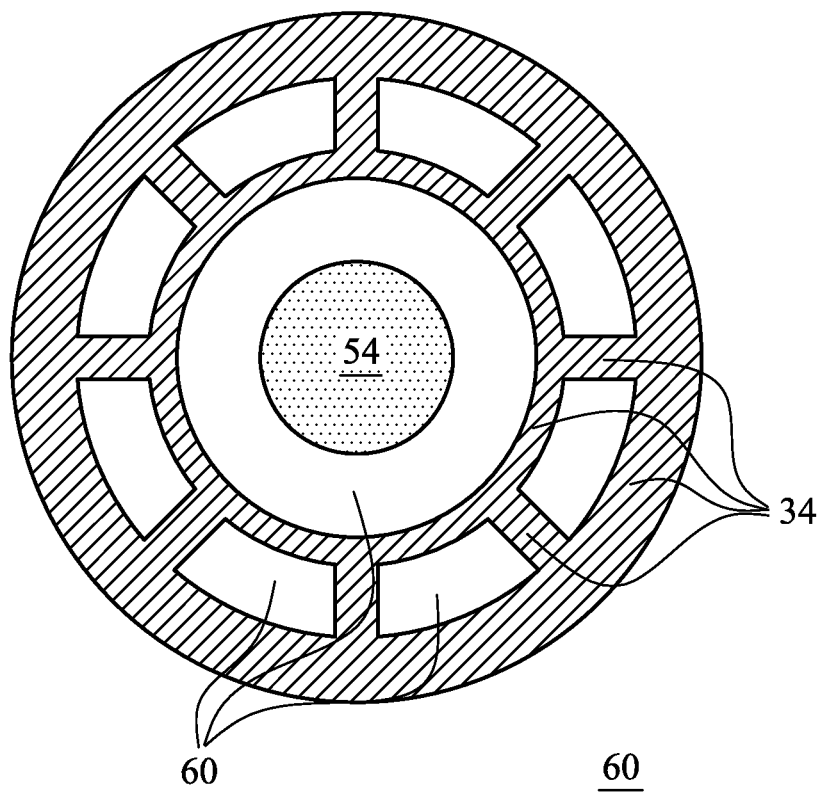

In FIG. 7E, remaining portions of buffer layer 34 may form rings encircling solder bumps 54, wherein the rings may have a square shape, a circle shape, and combinations thereof. The rings encircling different solder bumps 54 are spaced apart from each other by underfill 60. FIG. 7F illustrates that each solder bump 54 may be encircled by more than one ring that are connected from each other by additional portions of buffer layer 34.

In the embodiments, buffer layer 34 is patterned, and hence underfill 60 extends into the spacings between remaining portions of buffer layer 34. This prevents the delamination, if any, between underfill 60 and buffer layer 34 from growing in lateral directions. The reliability of the resulting package structure is thus improved. Further, the area of the interface between underfill 60 and underlying layers including buffer layer 34 and passivation layer 30 is also increased, resulting in a better adhesion between the underfill and the underlying layers.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a die comprising:
a metal pad;
a passivation layer covering edge portions of the metal pad;
a patterned buffer layer over the passivation layer, wherein the patterned buffer layer comprises a plurality of discrete portions separated from each other, and wherein one of the plurality of discrete portions of the patterned buffer layer comprises:
a first top surface;
a second top surface lower than the first top surface;
a bottom surface contacting a top surface of the passivation layer;
a first sidewall connecting the first top surface to the second top surface; and
a second sidewall connecting the second top surface to the top surface of the passivation layer;
an under-bump-metallurgy (UBM) in an opening in the patterned buffer layer and an opening in the passivation layer; and
a metal bump over and electrically coupled to the UBM.

2. The device of claim 1 further comprising an underfill comprising a first portion over the patterned buffer layer, and second portions extending into spacings between the plurality of discrete portions of the patterned buffer layer.

3. The device of claim 2, wherein the underfill is in contact with the passivation layer.

4. The device of claim 1, wherein each of the plurality of discrete portions of the patterned buffer layer comprises a center portion and an edge portion, wherein top surfaces of the center portion and the edge portion form a step, and wherein a height of the center portion is greater than a height of the edge portion, with the height of the center portion being measured as a distance between the top surface of the center portion and a top surface of the passivation layer.

5. The device of claim 1, wherein the patterned buffer layer is formed of polyimide.

6. The device of claim 1, wherein the plurality of discrete portions are separated from all UBMs in the die.

7. The device of claim 1, wherein the first top surface and the second top surface are substantially parallel to each other, and wherein an entirety of the second sidewall is lower than the first sidewall.

8. A device comprising:
a first work piece comprising a patterned buffer layer, with an opening in the patterned buffer layer;
a second work piece over the first work piece and comprising a dielectric layer;
a metal bump bonding the first work piece to the second work piece; and
an underfill between and contacting the patterned buffer layer and the dielectric layer, wherein the underfill contacts the metal bump and extends into the opening in the patterned buffer layer, wherein a portion of the underfill in the opening is in contact with a first and a second top surface of the patterned buffer layer with the first top surface being vertically between the second top surface and a bottom surface of the patterned buffer layer, and wherein the first and the second top surfaces form a step.

9. The device of claim 8, wherein a bottom surface of the underfill is level with the bottom surface of the patterned buffer layer.

10. The device of claim 8 further comprising a passivation layer underlying, and contacting, the patterned buffer layer, wherein a portion of the underfill in the opening is in contact with a top surface of the passivation layer.

11. The device of claim 8, wherein the patterned buffer layer comprises polyimide.

12. The device of claim 8, wherein the underfill is further in contact with a first sidewall and a second sidewall of the patterned buffer layer, and wherein the first sidewall connects the first top surface to the second top surface, and the second sidewall connects the second top surface to a bottom surface of the patterned buffer layer.

13. The device of claim 12, wherein a portion of the patterned buffer layer comprising the first top surface, the second top surface, the first sidewall, and the second sidewall is not in contact with any conductive material.

14. A device comprising:
a first work piece comprising a patterned buffer layer, wherein the patterned buffer layer comprises a plurality of discrete portions physically separated from each other;
a second work piece over the first work piece;
a metal bump bonding the first work piece to the second work piece; and
an underfill between and contacting the patterned buffer layer and the second work piece,
wherein the underfill separates the plurality of discrete portions of the patterned buffer layer apart from each other, and wherein each of the plurality of discrete portions of the patterned buffer layer comprises:
a first top surface; and
a second top surface forming a step with the first top surface, with the first top surface being vertically between the second top surface and a bottom surface of the patterned buffer layer, the bottom surface contacting a dielectric material.

15. The device of claim 14, wherein the underfill contacts sidewalls of the plurality of discrete portions of the patterned buffer layer.

16. The device of claim 14, wherein the first and the second top surfaces are substantially parallel to the bottom surface of the patterned buffer layer.

17. The device of claim 16, wherein the each of the plurality of discrete portions of the patterned buffer layer further comprises a third top surface vertically between the first and the second top surfaces, and wherein the third top surface forms steps with the first and the second top surfaces.

18. The device of claim 14, wherein the second top surface is substantially parallel to the first top surface, and wherein the each of the plurality of discrete portions of the patterned buffer layer further comprises a sidewall connecting the first top surface to the second top surface.

19. The device of claim 18, wherein all surfaces of the each of the plurality of discrete portions of the patterned buffer layer are in contact with dielectric materials.

* * * * *